United States Patent
Magrath et al.

(10) Patent No.: US 8,682,250 B2
(45) Date of Patent: Mar. 25, 2014

(54) NOISE CANCELLATION SYSTEM

(75) Inventors: Anthony James Magrath, Edinburgh (GB); Clive Robert Graham, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 351 days.

(21) Appl. No.: 13/001,586

(22) PCT Filed: Jun. 24, 2009

(86) PCT No.: PCT/GB2009/050720
§ 371 (c)(1),
(2), (4) Date: Dec. 27, 2010

(87) PCT Pub. No.: WO2009/156756
PCT Pub. Date: Dec. 30, 2009

(65) Prior Publication Data
US 2011/0130176 A1    Jun. 2, 2011

(30) Foreign Application Priority Data
Jun. 27, 2008 (GB) .................................. 0811863.0

(51) Int. Cl.
*H04B 1/00* (2006.01)
*H04B 15/00* (2006.01)

(52) U.S. Cl.
USPC ...... 455/63.1; 455/570; 455/114.2; 381/71.1; 381/94.1

(58) Field of Classification Search
USPC .................. 455/63.1, 570, 114.2; 381/71, 94
See application file for complete search history.

(56) References Cited

U.S. PATENT DOCUMENTS

| | | | |
|---|---|---|---|
| 3,644,674 A | 2/1972 | Mitchell et al. | |
| 5,815,582 A | 9/1998 | Claybaugh et al. | |
| 8,311,590 B2 * | 11/2012 | Horowitz | 455/570 |
| 2004/0047464 A1 * | 3/2004 | Yu et al. | 379/392.01 |
| 2004/0066940 A1 * | 4/2004 | Amir | 381/94.2 |
| 2008/0212791 A1 * | 9/2008 | Asada et al. | 381/71.6 |
| 2009/0316923 A1 * | 12/2009 | Tashev et al. | 381/66 |

FOREIGN PATENT DOCUMENTS

| | | |
|---|---|---|
| CN | 101091412 A | 12/2007 |
| EP | 0 411 801 A2 | 2/1991 |
| EP | 1 930 878 A1 | 6/2008 |
| GB | 2 436 657 A | 10/2007 |
| GB | 2 434 708 B | 2/2008 |
| WO | WO 2006/026812 A2 | 3/2006 |

* cited by examiner

*Primary Examiner* — Wen Huang
(74) *Attorney, Agent, or Firm* — Dickstein Shapiro LLP (57) ABSTRACT

A noise cancellation system for an audio system such as a mobile phone handset, or a wireless phone headset has a first input for receiving a first audio signal from one or more microphone positioned to receive ambient noise, and a second input for receiving a second audio signal from a microphone positioned to detect the user's speech, as well as a third input for receiving a third audio signal for example representing the speech of a person to whom the user is talking. A first noise cancellation block receives the first audio signal and generates a first noise cancellation signal, and this is combined with the third audio signal to form a first audio output signal. A second noise cancellation block receives at least a part of the first audio signal and said second audio signal and applying noise cancellation to generate a second audio output signal.

9 Claims, 11 Drawing Sheets

NOISE CANCELLATION SYSTEM

The present invention relates to noise cancellation, and in particular to noise cancellation in a system with both a received audio signal and a transmitted audio signal.

BACKGROUND

Noise cancellation systems are known, in which an electronic noise signal representing ambient noise is applied to a signal processing circuit, and the resulting processed noise signal is then applied to a speaker, in order to generate a sound signal. In order to achieve noise cancellation, the generated sound should approximate as closely as possible the inverse of the ambient noise, in terms of its amplitude and its phase.

In particular, feedforward noise cancellation systems are known, for use with headphones or earphones, in which one or more microphones mounted on the headphones or earphones detect an ambient noise signal in the region of the wearer's ear. In order to achieve noise cancellation, the generated sound then needs to approximate as closely as possible the inverse of the ambient noise, after that ambient noise has itself been modified by the headphones or earphones. One example of modification by the headphones or earphones is caused by the different acoustic path the noise must take to reach the wearer's ear, travelling around the edge of the headphones or earphones.

Noise cancellation systems are also known that serve to reduce noise on an outgoing signal. For example, in hands-free telephone headsets, noise cancellation may be applied to the outgoing voice signal, such that a called party is better able to distinguish the caller's voice from ambient noise that is picked up by the microphone in the caller's device. Such noise cancellation systems may employ a voice activity detector so that the voice itself is not cancelled from the outgoing signal.

SUMMARY OF INVENTION

According to a first aspect of the present invention, there is provided a noise cancellation system, comprising:
- a first input for receiving a first audio signal;
- a second input for receiving a second audio signal;
- a third input for receiving a third audio signal;
- a first noise cancellation block for receiving said first audio signal and generating a first noise cancellation signal;
- a first combiner, for combining said third audio signal and said first noise cancellation signal and generating a first audio output signal;
- a second noise cancellation block for receiving at least a part of said first audio signal and said second audio signal and applying noise cancellation to generate a second audio output signal.

According to a second aspect of the present invention, there is provided audio system, comprising a noise cancellation system according to the first aspect of the invention.

BRIEF DESCRIPTION OF THE DRAWINGS

For a better understanding of the present invention, and to show more clearly how it may be carried into effect, reference will now be made, by way of example, to the following drawings, in which.

DETAILED DESCRIPTION

Figure 1:
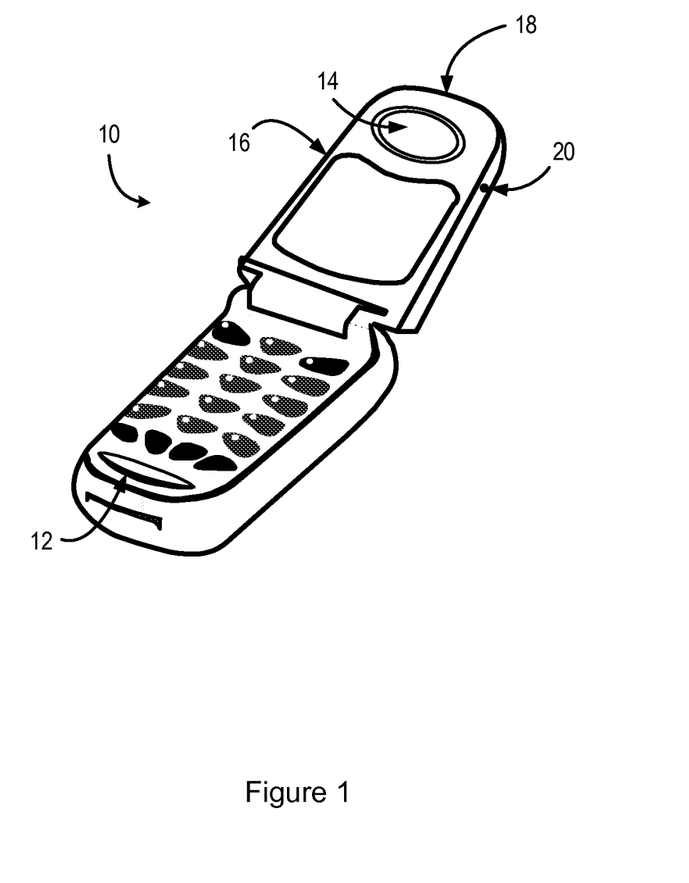
FIG. 1 shows a mobile phone incorporating a noise cancellation system in accordance with the invention.

FIG. 1 is a schematic diagram showing a mobile phone 10 incorporating a noise cancellation system according to the present invention.

Many of the functions of the mobile phone 10 are generally conventional and will not be described in great detail except as necessary to describe the invention.

The mobile phone 10 comprises a first microphone 12 positioned in order to detect the voice of a user, and a loudspeaker 14 positioned in order to play a received voice signal towards the user's ear. Further, according to the present invention, the mobile phone 10 also comprises a plurality of microphones, in this example, three microphones 16, 18, 20, that are positioned generally around the mobile phone in order to detect ambient noise in its vicinity. Detailed operation of these microphones will be described in more detail below; however, it will be apparent to those skilled in the art that any number of microphones may be used to detect ambient noise, including as few as one.

Figure 2:
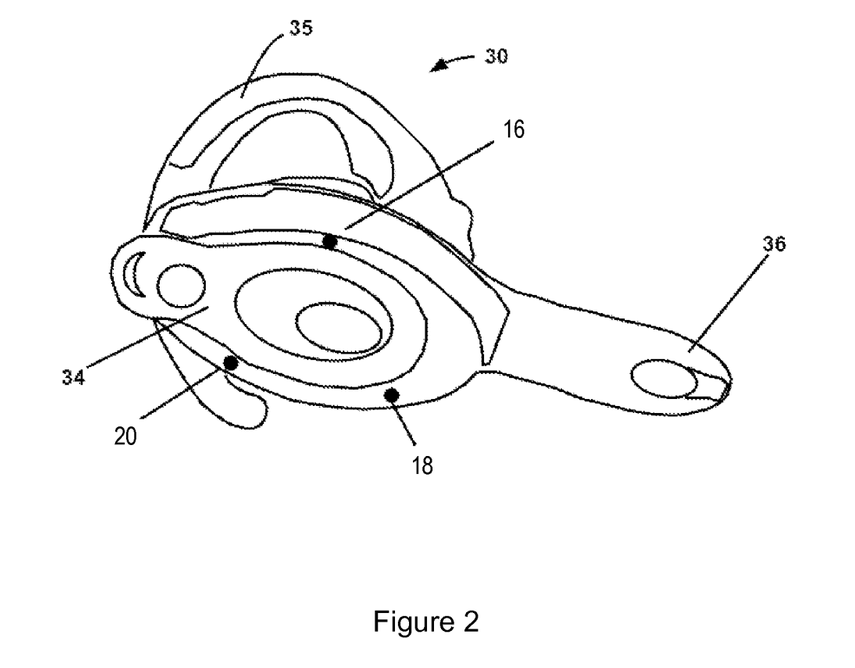
FIG. 2 shows a first headset incorporating a noise cancellation system in accordance with the invention.

FIG. 2 is a schematic diagram showing a wireless headset 30 incorporating a noise cancellation system according to the present invention. The wireless headset 30 may for example contain circuitry allowing it to communicate with a mobile phone or other audio device, for example using the Bluetooth short range wireless protocol.

As is conventional, the headset 30 has a loudspeaker (not visible in FIG. 2) for playing sounds to the user, and also has an earclip 35 and a microphone 36 mounted on a boom that is positioned close to the user's mouth when the clip is worn over the user's ear.

In addition, the headset 30 also comprises a plurality of microphones, in this example, three microphones 16, 18, 20, that are positioned generally around the headset in order to detect ambient noise in its vicinity. Again, detailed operation of these microphones will be described in more detail below, but it will be apparent to those skilled in the art that any number of microphones may be used to detect ambient noise, including as few as one.

Figure 3:
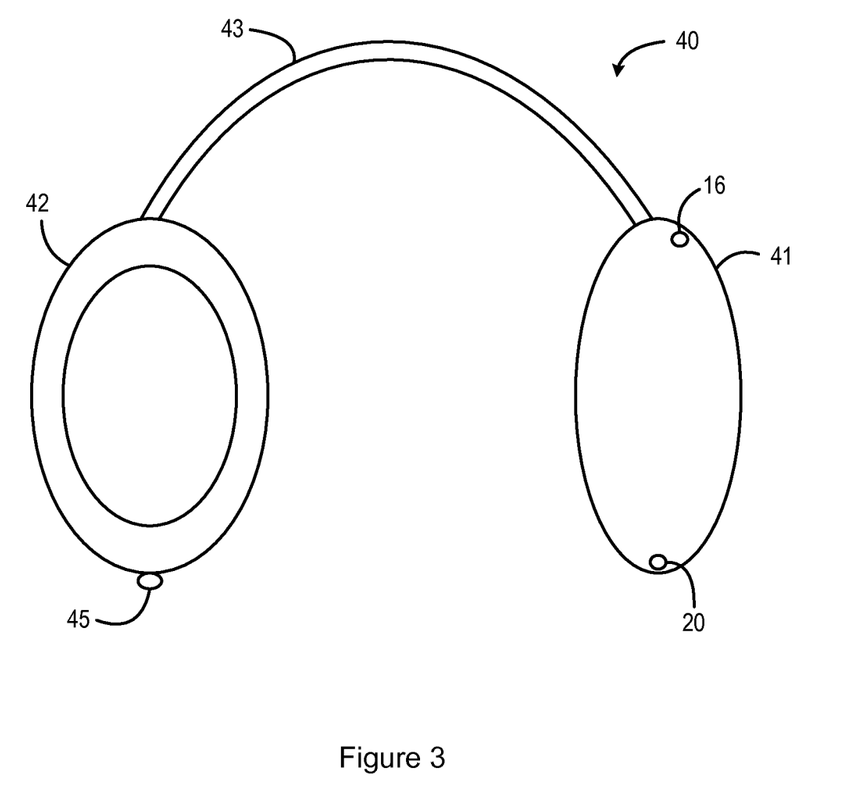
FIG. 3 shows a second headset incorporating a noise cancellation system in accordance with the invention.

FIG. 3 is a schematic diagram showing an alternative form of wireless headset 40 incorporating a noise cancellation system according to the present invention. As before, the wireless headset 40 contains circuitry allowing it to communicate with a mobile phone or other audio device, for example using the Bluetooth short range wireless protocol. Further, the headset 40 has two earpieces 41, 42 that are connected by a band 43 such that the earpieces are on the ears of a wearer, and the earpieces 41, 42 each contain a loudspeaker for playing sounds to the user.

In this case, one of the earpieces 41 contains a microphone 45 that is primarily intended for detecting the wearer's speech.

In addition, each of the earpieces 41, 42 includes at least one microphone positioned generally around the headset in order to detect ambient noise in its vicinity. In this case, the earpiece 41 has two such microphones 16, 20, and the earpiece 42 has two further such microphones (not visible in FIG. 3 as they are positioned on the outer surface of the earpiece 42). Again, detailed operation of these microphones will be described in more detail below, but it will be apparent to those skilled in the art that any number of microphones may be used to detect ambient noise, including as few as one.

Thus, three audio systems have been shown in FIGS. 1 to 3, but it will be appreciated by those skilled in the art that the present invention is equally applicable to other systems having a received audio signal and an outgoing audio signal. Examples of such systems include recording/playback devices, walkie-talkies, headsets for computers, etc.

Figure 4:
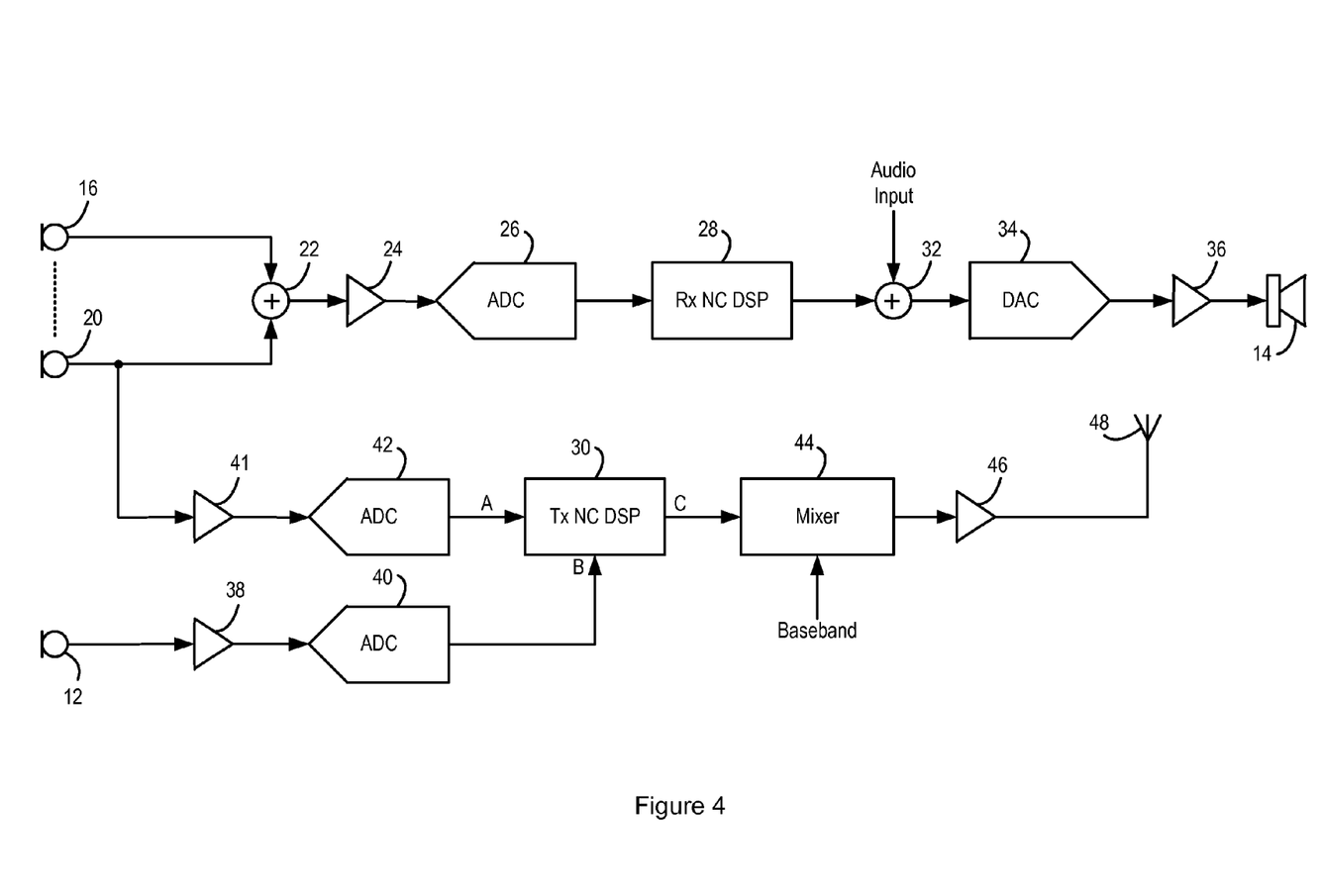
FIG. 4 is a block schematic diagram, illustrating a first noise cancellation system in accordance with the invention.

FIG. 4 shows some of the circuitry present in a noise cancellation device according to the present invention. Specifically, FIG. 4 shows the circuitry in the case that there are two microphones 16, 20 that are positioned to detect the ambient noise, although, as discussed above, there may be any number of such microphones.

Signals from the noise microphones 16, 20 are combined in an adder 22. The mixed signal is amplified in an amplifier 24, and the amplified analogue signal converted to digital signal in an analogue-to-digital converter (ADC) 26. The digital signal is then input to a receive circuitry noise cancellation digital signal processor (Rx NC DSP) 28.

Those skilled in the art will appreciate that this section of circuitry may be realized in a number of different ways, as will be described in more detail below. Various examples of the detailed operation of the Rx NC DSP 28 are given below; however, the invention is not to be considered as limited to any one of these examples.

As discussed above, the microphones 16, 20 are positioned such that they detect primarily the ambient noise in the vicinity of the device that carries the microphones, although they will typically also detect the voice of the user to at least some extent. The Rx NC DSP 28 therefore receives a signal that is indicative or representative of the ambient noise that is reaching the user's ear, or ears, and outputs a corresponding noise cancellation signal.

The noise cancellation signal output from the Rx NC DSP 28 is added to an audio input in a mixer 32. The type of audio input will typically vary according to the system in which the noise cancellation device is embodied. For example, where the device is embodied in a mobile phone, the audio input may be a received voice signal from a called or calling party. Similarly, where the device is embodied in a walkie-talkie, the audio input may again be the received voice of a third party. Alternatively, the audio input may be audio associated with a computer game or music for example. Such audio inputs will typically be digital in nature (from data storage/carrier means such as solid state memory or CD/DVD etc.), and therefore the audio input is mixed with the noise cancellation signal prior to being converted to analogue in a digital-to-analogue converter (DAC) 34, amplified by an amplifier 36, and output to the loudspeaker 14 (in the handset shown in FIG. 1). However, it will be appreciated by those skilled in the art that the audio input may be analogue, and therefore mixed with the noise cancellation signal after it has been converted to analogue.

In either case, the Rx NC DSP 28 is designed to be such that the noise cancellation signal that is added to the audio input and then reproduced in the loudspeaker 14 has the effect of cancelling the ambient noise at the user's ear. The noise cancellation circuitry can thus be regarded as increasing the articulation index, that is, the proportion of the audio input that is detectable by the user, in the presence of a given ambient noise field.

Ambient noise in the vicinity of the user can also be a problem for the user in the sense that his speech may be poorly detected by another person with whom he is communicating.

In order to mitigate this problem, noise cancellation is applied to the user's speech before it is transmitted over the relevant communications link.

In this embodiment of the invention, a signal generated by the noise microphones is used in this transmit path noise cancellation.

Specifically, an analogue signal is output from the voice microphone 12 to an amplifier 38 and converted to a digital signal by an ADC 40. This signal is intended to be representative of the user's voice, although it will be appreciated that the microphone 12 will also detect ambient noise, and so the signal will also contain a component that is representative of such noise. The digital voice signal output by the ADC 40 is then input to a transmit circuitry noise cancellation digital signal processor (Tx NC DSP) 30.

Although FIG. 4 shows only one voice microphone, a person skilled in the art will appreciate that a plurality of voice microphones may be used to detect the voice of the user. In this instance, the signals from the respective voice microphones may be combined in various ways.

In order to achieve the noise cancellation effect, the analogue signal generated by the second noise microphone 20 is applied to an amplifier 41, and the amplified signal is passed to an analogue-digital converter 42, with the resulting signal being supplied as a noise input to the Tx NC DSP 30.

The Tx NC DSP 30 therefore receives at least one signal representing a voice and at least one signal representing the ambient noise. The Tx NC DSP 30 uses these signals to generate a clean voice signal, that is, a voice signal wherein the ambient noise has been reduced or removed altogether. Various examples of the operation of Tx NC DSP 30 are given below. However, the invention is not to be considered as limited to any one particular example.

The clean voice signal is output from the Tx NC DSP 30, and applied to a baseband mixer 44, which is used here to represent the functions required to put the signal into a form in which it can be used in the relevant telecommunications system. The resulting signal is then amplified in an amplifier 46 and transmitted from a transmit antenna 48. Thus, in this case, the mixer 44 performs a wide range of functions, such as sampling the signal, converting the resulting voice data into the required format, upconverting the signal to the required transmit frequency, and so on, as will be apparent to the person skilled in the art.

Those skilled in the art will appreciate that many features have been omitted from FIG. 4 for clarity. Moreover, the circuitry shown in FIG. 4 is adapted for use in a mobile phone. When embodied in other devices, such as a headset for a computer, for example, the 'clean' voice signal may not be transmitted via an antenna, but rather through a wired connection with the computer.

Noise cancellation on the outgoing voice signal may be achieved in a number of different ways, and one form of noise cancellation is described in more detail below. In addition, some form of voice activity detector (VAD) may be required in order to prevent the noise cancellation signal from cancelling the wanted voice signal as well as the ambient noise. That is, the VAD detects when the user is speaking, and ensures that the signals representing the noise are generated during time periods when the user is not speaking, so that they do not include components representing the voice, and thereby ensuring that the noise cancellation signals that are generated only cancel the ambient noise and not the voice of the user.

Figure 5:
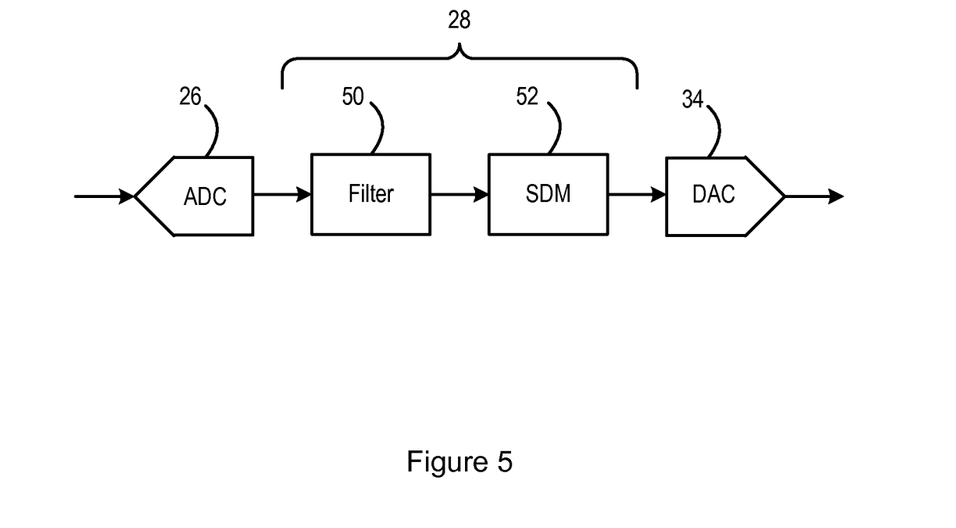
FIG. 5 is a block schematic diagram, illustrating a first noise cancellation block in the noise cancellation system of FIG. 4.

FIG. 5 shows one example of the circuitry of the Rx NC DSP 28.

In the illustrated example, the ADC 26 outputs a signal to a digital filter 50 which generates a noise cancellation signal. In general, the output of the digital filter 50 has a higher number of bits than the input to the digital filter 50, so a sigma-delta modulator (SDM) 52 is provided to reduce the number of bits of the noise cancellation signal. A lower number of bits makes the design of the DAC 34 much easier. In one embodiment, the ADC 26 outputs a digital signal with just one bit, and the digital filter 50 is a 1-bit filter. In a further embodiment, the output of the SDM 52 also has one bit. As an alternative to the arrangement shown in FIG. 5, the audio input may be added between the filter 50 and the SDM 52.

Figure 6:
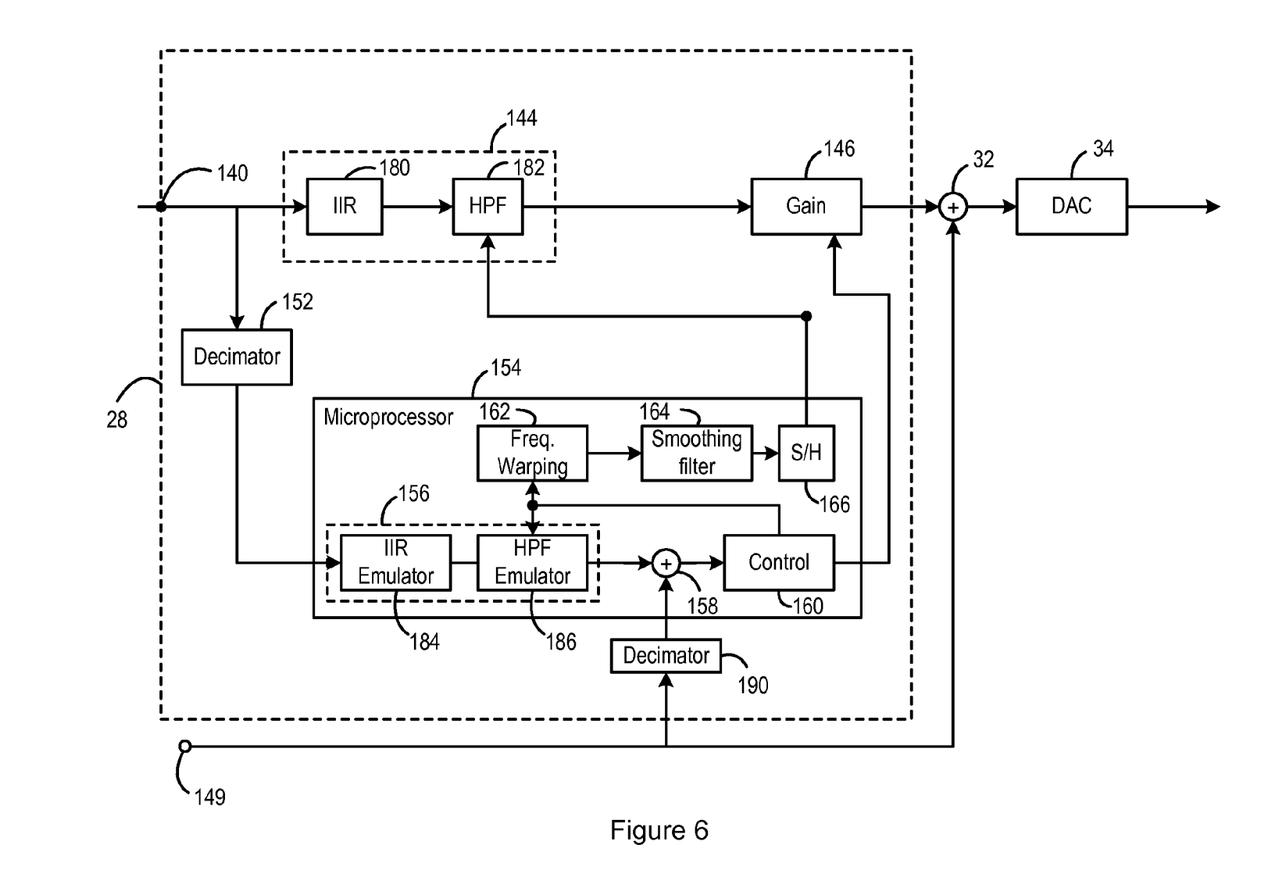
FIG. 6 is a block schematic diagram, illustrating an alternative form of the first noise cancellation block in the noise cancellation system of FIG. 4.

FIG. 6 shows a further example of the circuitry of Rx NC DSP 28.

An input 140 is connected to receive the digital signal from the analog-digital converter 26. This input digital signal is applied to an adaptable digital filter 144, and the filtered signal is applied to an adaptable gain device 146.

The resulting noise cancellation signal is output from the DSP 28, and applied to the adder 32 as described previously, where it is summed with the wanted audio signal from an input 149. The sum signal is then applied to the DAC 34.

Thus, the filtering and level adjustment applied by the filter 144 and the gain device 146 are intended to generate a noise cancellation signal that allows the detected ambient noise to be cancelled from the receive path of the device. As is recognized in the art, the filtering and level adjustment should be as far as possible such that the noise cancellation signal, when applied to the loudspeaker 14, generates a sound signal that cancels the ambient noise reaching the ear of the user. The filtering and level adjustment thus need to take into account the properties of the microphones 16, 20 and the loudspeaker 14, the sound attenuation caused by holding the device close to the user's ear, and so on.

As mentioned above, the noise cancellation signal is produced from the input signal by the adaptable digital filter 144 and the adaptable gain device 146, and these are controlled by a control signal, which is generated by a microprocessor 154. Specifically, the digital signal output from the analog-digital converter 26 at the input 140 is applied to a decimator 152 which reduces the digital sample rate, and then to the microprocessor 154, which contains a block 156 that emulates the filter 144 and gain device 146, and produces an emulated filter output. The emulated filter output is applied to an adder 158, where it is summed with the wanted audio signal from the second input 149.

The resulting signal is applied to a control block 160, which generates control signals for adjusting the properties of the filter 144 and the gain device 146. The control signal for the filter 144 is applied through a frequency warping block 162, a smoothing filter 164 and sample-and-hold circuitry 166 to the filter 144. The same control signal is also applied to the block 156, so that the emulation of the filter 144 matches the adaptation of the filter 144 itself. In one embodiment, the control signal for the filter 144 is generated on the basis of a comparison of the output of the adder 158 with a threshold value. For example, if the output of the adder 158 is too high, the control block 160 may generate a control signal such that the output of the filter 144 is lowered. In one embodiment, this may be through lowering the cut-off frequency of the filter 144.

In this illustrated embodiment of the invention, the filter 144 comprises a fixed IIR filter 180 and an adaptive high-pass filter 182, and the filter emulation 156 similarly comprises a fixed IIR filter 184 and an adaptive high-pass filter 186, which either mirror, or are sufficiently accurate approximations of, the filters which they emulate.

However, the illustrated embodiment contemplates any filter arrangement, in which the filter comprises a filter stage or multiple filter stages, provided that at least one such stage is adaptive. Moreover, the filter may be relatively complex, such as an IIR filter, or may be relatively simple, such as a low-order low-pass or high-pass filter.

Further, the possible filter adaptation may be relatively complex, with several different parameters being adaptive, or may be relatively simple, with just one parameter being adaptive. For example, in the illustrated embodiment, the adaptive high-pass filter 182 is a first-order filter controllable by a single control value, which has the effect of altering the filter corner frequency. However, in other cases the adaptation may take the form of altering several parameters of a higher order filter, or may in principle take the form of altering the full set of filter coefficients of an IIR filter.

It is well known that, in order to process digital signals, it is necessary to operate with signals that have a sample rate that is at least twice the frequency of the information content of the signals, and that signal components at frequencies higher than half the sampling rate will be lost. In a situation where signals at frequencies up to a cut-off frequency must be handled, there is thus defined the Nyquist sampling rate, which is twice this cut-off frequency.

A noise cancellation system is generally intended to cancel only audible effects. As the upper frequency of human hearing is typically 20 kHz, this would suggest that acceptable performance could be achieved by sampling the noise signal at a sampling rate in the region of 40 kHz. However, in order to achieve adequate performance, this would require sampling the noise signal with a relatively high degree of precision, and there would inevitably be delays in the processing of such signals.

In the illustrated embodiment of the invention, therefore, the analog-digital converter 26 generates a digital signal at a sample rate of 2.4 MHz, but with a bit resolution of only 3 bits. This allows for acceptably accurate signal processing, but with much lower signal processing delays. In other embodiments of the invention, the sample rate of the digital signal may be 44.1 kHz, or greater than 100 kHz, or greater than 300 kHz, or greater than 1 MHz.

As described above, the filter 144 is adaptive. That is, a control signal can be sent to the filter to change its properties, such as its frequency characteristic. In the illustrated embodiment of this invention, the control signal is sent not at the sampling rate of the digital signal, but at a lower rate. This saves power and processing complexity in the control circuitry, in this case the microprocessor 154.

The control signal is sent at a rate that allows it to adapt the filter sufficiently quickly to handle changes that may possibly produce audible effects, namely at least equal to the Nyquist sampling rate defined by a desired cut-off frequency in the audio frequency range.

Although it would be desirable to be able to achieve noise cancellation across the whole of the audio frequency range, in practice it is usually only possible to achieve good noise cancellation performance over a part of the audio frequency range. In a typical case, it is considered preferable to optimize the system to achieve good noise cancellation performance over the lower part of the audio frequency range, for example from 80 Hz to 2.5 kHz. It is therefore sufficient to generate a control signal having a sample rate which is twice the frequency above which it is not expected to achieve outstanding noise cancellation performance.

In the illustrated embodiment of the invention, the control signal has a sampling rate of 8 kHz, but, in other embodiments of the invention, the control signal may have a sampling rate which is less then 2 kHz, or less than 10 kHz, or less than 20 kHz, or less than 50 kHz.

In the illustrated embodiment of the invention, the decimator 152 reduces the sample rate of the digital signal from 2.4 MHz to 8 kHz, and the microprocessor 154 produces a control signal at the same sampling rate as its input signal. However, the microprocessor 154 can in principle produce a control signal having a sampling rate that is higher, or lower, than its input signal received from the decimator 152.

The illustrated embodiment shows the noise signal being received from an analog source, such as a microphone, and being converted to digital form in an analog-digital converter 42 in the signal processing circuitry. However, it will be appreciated that the noise signal could be received in a digital form, from a digital microphone, for example.

Further, the illustrated embodiment shows the noise cancellation signal being generated in a digital form, and being converted to analog form in a digital-analog converter 150 in the signal processing circuitry. However, it will be appreciated that the noise cancellation signal could be output in a digital form, as in Class D type applications for example.

In these illustrated embodiments, the receive path noise cancellation circuitry 28 is a strict feedforward noise cancellation block, where signal processing is applied to the detected noise signal, and the signal processing takes account of the known or predicted properties of the system, such as the microphones and loudspeakers and the physical shape of the device in which the noise cancellation occurs, and also takes account of the properties of the detected noise signal, but where there is no feedback microphone positioned to detect the sounds reaching the ear of the user, or feedback circuitry to adapt the noise cancellation on the basis of such detected sounds.

Figure 7:
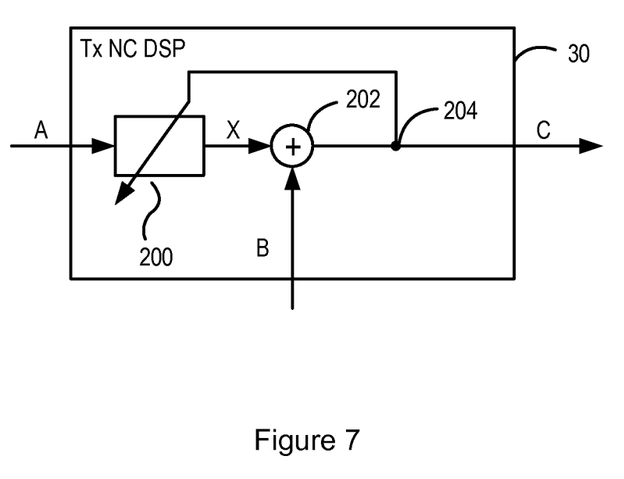
FIG. 7 is a block schematic diagram, illustrating a second noise cancellation block in the noise cancellation system of FIG. 4.

FIG. 7 is a schematic diagram showing the form of the second noise cancellation block, namely the Tx NC DSP 30. Specifically, the detected ambient noise signal, at input A, is applied to an adaptive filter 200 to generate a filtered signal at X that is an amplified digital estimate of the ambient noise reaching the microphone 16. This signal is applied to an adder 202, where it is subtracted from the amplified digital version of the signal detected by the microphone 12, i.e. the signal at input B of the DSP 30. The resulting noise cancelled signal at output C of the DSP 30 is used as the basis for the voice signal to be transmitted by the device, and is also tapped off at the tap point 204, to be used as the basis for adapting the filter 200. The transmit path noise cancellation circuitry 30 is thus a feedback noise cancellation circuit.

In addition to the filtering shown above, it is also possible to include at least one delay element, connected so as to delay the received voice signal B, and/or connected so as to delay the noise signal A. Any slight delay in the transmission of the voice signal should not be detectable by a person to whom the user is speaking, but the presence of the delay may allow the system to equalize the arrival times of the noise signal A and the noise component of the voice signal B. Any such delay element in the voice path can be in the DSP 30, or separate, and may be associated with the ADC 40.

Figure 8:
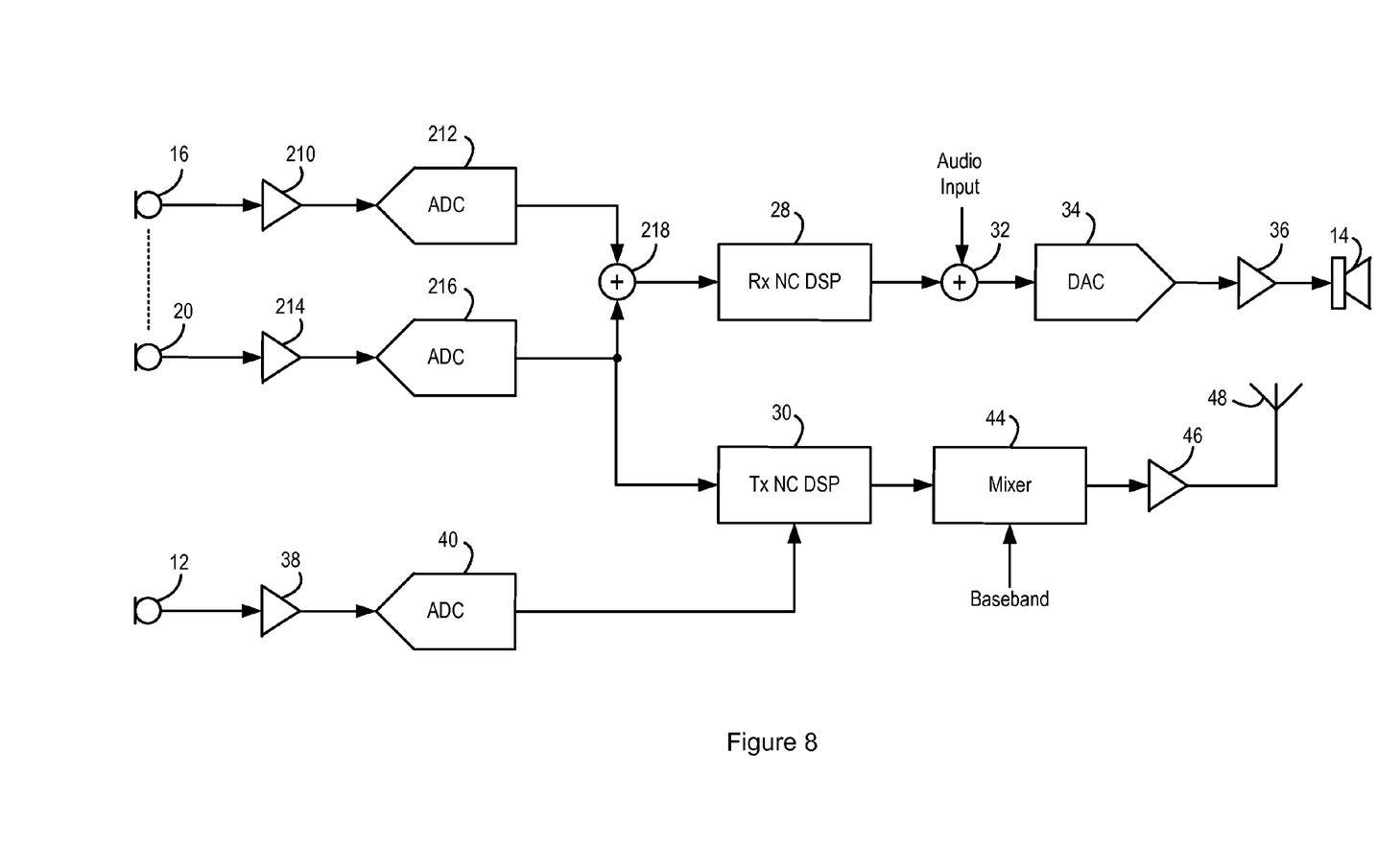
FIG. 8 is a block schematic diagram, illustrating a second noise cancellation system in accordance with the invention.

FIG. 8 shows an alternative form of the noise cancellation circuitry, in which the signals from the noise microphones are added together in the digital domain, but is otherwise the same as the noise cancellation circuitry shown in FIG. 4. FIG. 8 therefore uses the same reference numerals as FIG. 4 for these common components, and will not be described further. Thus, the signal from the first noise microphone 16 is amplified in a first amplifier 210, and the amplified analogue signal converted to a digital signal in a first analogue-to-digital converter (ADC) 212. The signal from the second noise microphone 20 is amplified in a second amplifier 214, and the amplified analogue signal converted to a digital signal in a second analogue-to-digital converter (ADC) 216. The two digital signals are combined in an adder 218, and the resulting combined digital signal is then input to the receive circuitry noise cancellation digital signal processor (Rx NC DSP) 28. At the same time, the digital signal from the second analogue-to-digital converter (ADC) 216 is input to the transmit circuitry noise cancellation digital signal processor (Tx NC DSP) 30.

In the embodiments shown in FIGS. 4 and 8, there are multiple microphones 16, 20 positioned to detect the ambient noise. While the signals from these multiple microphones are combined to form the noise cancellation signal in the receive path, the signal from only one of them (i.e. the microphone 20 in FIGS. 4 and 8) is used to generate the noise cancellation signal used in the transmit path. For example, the microphone 20 may be selected because it is positioned closer to the voice microphone 12 and may therefore be expected to provide a better estimate of the ambient noise reaching the voice microphone.

Figure 9:
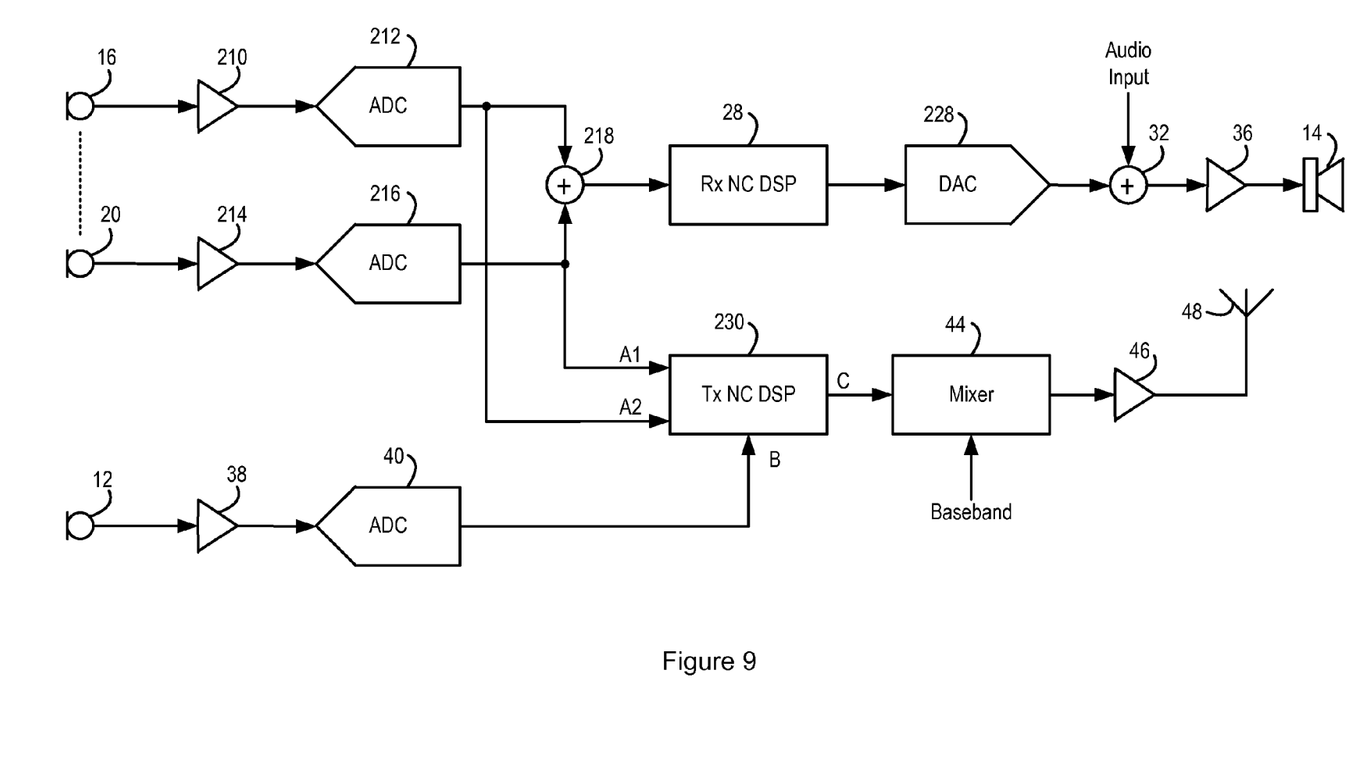
FIG. 9 is a block schematic diagram, illustrating a third noise cancellation system in accordance with the invention.

FIG. 9 shows an alternative form of the noise cancellation circuitry, in which the signals from both noise microphones are used in the transmit path noise cancellation block. FIG. 9 therefore uses the same reference numerals as FIG. 8 for the common components, which will not be described further.

It will however be noted that, in the embodiment shown in FIG. 9, the noise cancellation signal output from the Rx NC DSP 28 is applied to a DAC 228, and the resulting analogue signal is applied to the adder 32, where it is combined with an analogue audio input. It will be apparent that this arrangement is interchangeable with the arrangements shown in FIGS. 4 and 8, where a digital audio input is present.

In the embodiment shown in FIG. 9, the digital signals output from the first analogue-to-digital converter (ADC) 212 and the second analogue-to-digital converter (ADC) 216 are both applied as inputs A1 and A2 respectively to the transmit circuitry noise cancellation digital signal processor (Tx NC DSP) 230.

Figure 10:
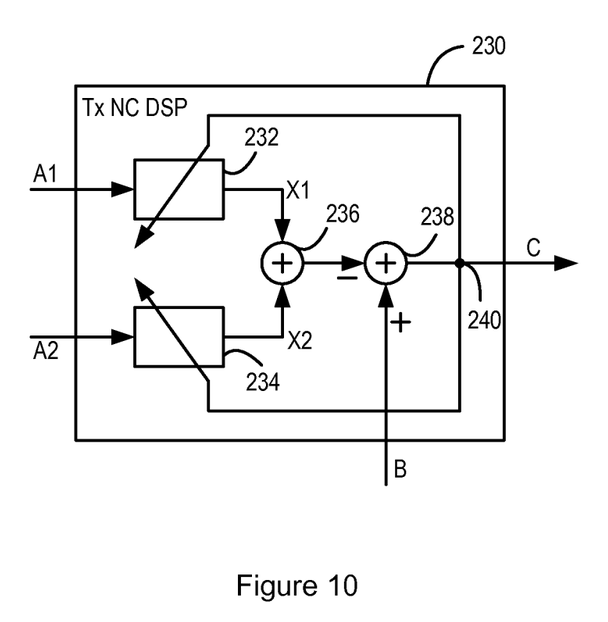
FIG. 10 is a block schematic diagram, illustrating a second noise cancellation block in the noise cancellation system of FIG. 9.

FIG. 10 shows in more detail the form of the second noise cancellation block, i.e. the transmit circuitry noise cancellation digital signal processor (Tx NC DSP) 230 in the embodiment of FIG. 9.

Specifically, the detected ambient noise signal output from the first analogue-to-digital converter (ADC) 212, at input A1, is applied to a first adaptive filter 232 to generate a filtered signal at X1 that is an amplified digital estimate of the ambient noise reaching the microphone 20, while the detected ambient noise signal output from the second analogue-to-digital converter (ADC) 216, at input A2, is applied to a second adaptive filter 234 to generate a filtered signal at X2 that is an amplified digital estimate of the ambient noise reaching the microphone 16. The filtered signals at X1 and X2 are summed in adder 236 to form a signal representative of the ambient noise. This signal is applied to an adder 238, where it is subtracted from the amplified digital version of the signal detected by the microphone 12, i.e. the signal at input B of the DSP 30. The resulting noise cancelled signal at output C of the DSP 30 is used as the basis for the voice signal to be transmitted by the device, and is also tapped off at the tap point 240, to be used as the basis for adapting the filters 232 and 234. The transmit path noise cancellation circuitry 30 is thus a feedback noise cancellation circuit.

Figure 11:
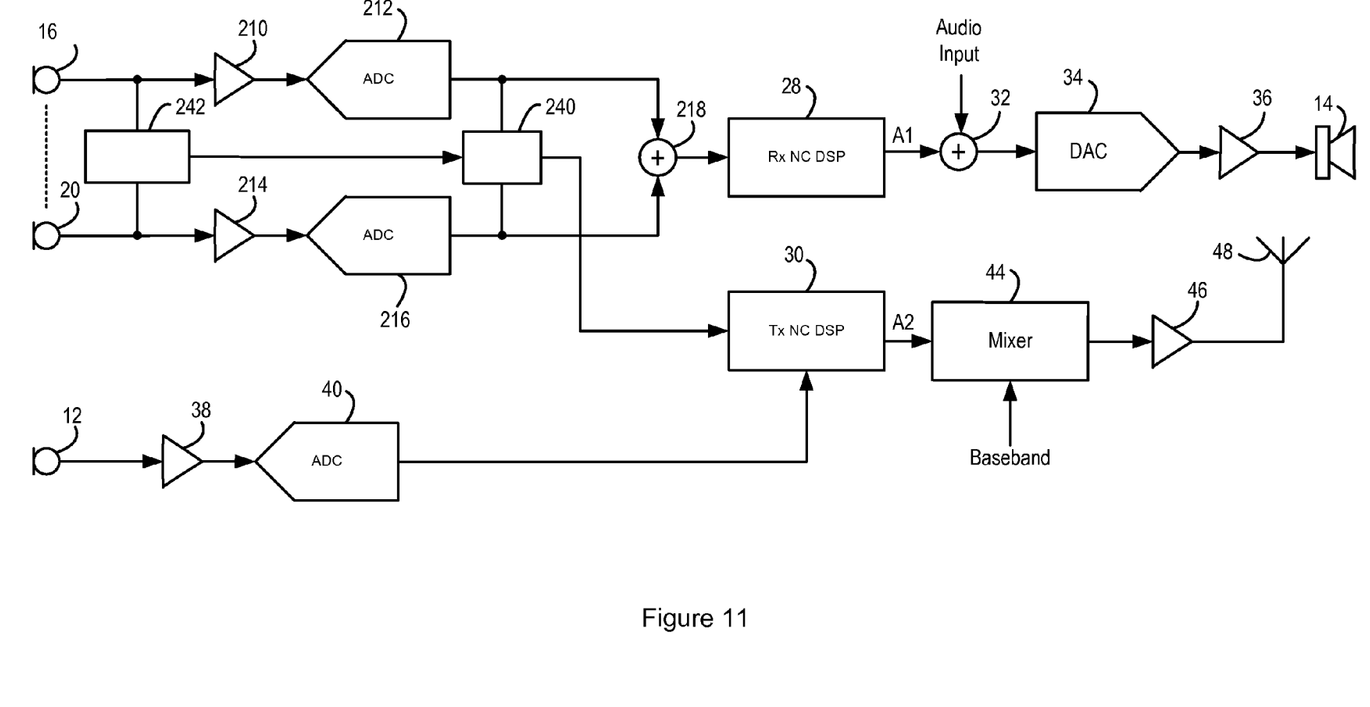
FIG. 11 is a block schematic diagram, illustrating a fourth noise cancellation system in accordance with the invention.

FIG. 11 shows an alternative form of the noise cancellation circuitry, in which the signals from both noise microphones are available for use, but only one of them is used in the transmit path noise cancellation block. FIG. 11 therefore uses the same reference numerals as FIG. 9 for the common components, which will not be described further.

In the embodiment shown in FIG. 11, the digital signals output from the first analogue-to-digital converter (ADC) 212 and the second analogue-to-digital converter (ADC) 216 are both applied to a switch 240, with one of these signals then being supplied as the input A to the transmit circuitry noise cancellation digital signal processor (Tx NC DSP) 30, which may therefore be as shown in FIGS. 4 and 7.

The switch 240 is controlled by a comparator or level detector 242, which detects the signals produced by the two noise microphones 16, 20, and selects one of the digital signals output from the first analogue-to-digital converter (ADC) 212 and the second analogue-to-digital converter (ADC) 216 on the basis of its comparison or detection result. For example, the comparator or level detector 242 may select the one of the digital signals output from the first analogue-to-digital converter (ADC) 212 and the second analogue-to-digital converter (ADC) 216 that corresponds to the larger of the two signals produced by the two noise microphones 16, 20.

The comparator or level detector 242 may instead act on the signals generated by the amplifiers 210, 214, or on the signals generated by the ADCs 212, 216 themselves. There are thus described noise cancellation systems that use noise microphones to detect ambient noise for the purposes of noise cancellation in the signals supplied to the user, and use the same noise microphones to generate a noise signal that can be subtracted from a wanted voice signal for transmission in a communication system.

All of the embodiments described so far use analog microphones, and analogue-digital converters acting on the detected signals. Alternatively, digital microphones (such as MEMS digital microphones) may be employed to generate digital signals representative of the ambient noise, such that no analog-digital converters are needed within the NC system.

As mentioned above, the second noise cancellation block attempts to cancel noise from the speech signal that is transmitted, and it is advantageous therefore to detect the ambient noise during periods when the user is not speaking. In one embodiment of the invention, the ambient noise level is taken to be the noise level during the quietest period within a longer period. Thus, in one embodiment, where the signal from the noise microphones 16, 20 is converted to a digital signal at a sample rate of 8 kHz, the digital samples are divided into frames, each comprising 256 samples, and the average signal magnitude is determined for each frame. Then, the ambient noise level at any time is determined to be the frame, from amongst the most recent 32 frames, having the lowest average signal magnitude.

Thus, it is assumed that, in each period of 32×256 samples (=approximately 1 second), there will be one frame where the user will not be making any sound, and the detected signal level during this frame will accurately represent the ambient noise.

In an alternative embodiment, the noise cancellation device may comprise a transducer such as an accelerometer for example that is placed in close connection with the user's face. Vibrations caused by the user's speech may be detected by the transducer, allowing a determination of which sound is caused by the user's voice, and which sound is caused by the ambient noise.

Further alternative methods of detecting the voice of the user may be thought of by those skilled in the art, and such methods may be considered as falling within the scope of the invention as defined by the claims appended hereto.

Noise cancellation systems according to the present invention may be employed in many devices, as would be appreciated by those skilled in the art. For example, they may be employed in mobile phones, headphones, earphones, headsets, etc.

The skilled person will recognise that the above-described apparatus and methods may be embodied in whole or in part as processor control code, for example on a carrier medium such as a disk, CD- or DVD-ROM, programmed memory such as read only memory (firmware), or on a data carrier such as an optical or electrical signal carrier. For many applications, embodiments of the invention will be implemented on a DSP (digital signal processor), ASIC (application specific integrated circuit) or FPGA (field programmable gate array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (very high speed integrated circuit hardware description language). As the skilled person will appreciate, the code may be distributed between a plurality of coupled components in communication with one another. Where appropriate, the embodiments may also be implemented using code running on a field-(re-)programmable analogue array or similar device in order to configure analogue/digital hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. A noise cancellation system, comprising:
   a first input for receiving a first audio signal comprising signals from a plurality of microphones;
   a second input for receiving a second audio signal;
   a third input for receiving a third audio signal;
   a first combiner, for combining said third audio signal and a first noise cancellation signal and generating a first audio output signal;
   a first noise cancellation block for receiving said first audio signal and generating the first noise cancellation signal, wherein a second combiner is used to combine the signals from the plurality of microphones and pass the combined signals to the first noise cancellation block;

a second noise cancellation block for receiving said second audio signal and a part of said first audio signal, as selected from only one of the microphones, and applying noise cancellation to generate a second audio output signal; and a selector, for selecting the signal from only one of the microphones, and for passing the selected signal to the second noise cancellation block.

2. A noise cancellation system as claimed in claim 1, wherein the selector comprises a level detector, for selecting the largest signal of the signals from the plurality of microphones.

3. A noise cancellation system, comprising:
a first input for receiving a first audio signal;
a second input for receiving a second audio signal;
a third input for receiving a third audio signal;
a first noise cancellation block for receiving said first audio signal and generating a first noise cancellation signal;
a first combiner, for combining said third audio signal and said first noise cancellation signal and generating a first audio output signal; and
a second noise cancellation block for receiving at least a part of said first audio signal and said second audio signal and applying noise cancellation to generate a second audio output signal,
wherein the first noise cancellation block includes a feedforward noise cancellation block and further comprises:
a digital filter, for receiving said signal representative of ambient noise, said signal representative of ambient noise having a first sample rate;
a decimator, connected to the input to receive the signal representative of ambient noise and to generate a decimated signal at a second sample rate lower than the first sample rate; and
a processor, wherein the processor comprises:
an emulation of the digital filter, connected to receive the decimated signal and to generate an emulated filter output; and
a control circuit, for generating a control signal on the basis of the emulated filter output,
wherein the control signal is applied to the digital filter to control a filter characteristic thereof.

4. A noise cancellation system as claimed in claim 3, wherein the processor comprises:
a source input, for receiving said audio signal; and
an adder, for forming a sum of the emulated filter output and the audio signal,
wherein the control circuit is configured to generate the control signal on the basis of a comparison between said sum of the emulated filter output and the audio signal and a threshold value.

5. A noise cancellation system as claimed in claim 3, wherein the emulation of the digital filter comprises a lower order approximation of the digital filter.

6. A noise cancellation system as claimed in claim 5, wherein the digital filter comprises a sixth order IIR filter, and the emulation of the digital filter comprises a second order approximation of the digital filter.

7. A noise cancellation system as claimed in claim 3, wherein the digital filter comprises a fixed part and an adaptive part.

8. A noise cancellation system as claimed in claim 7, wherein the emulation of the digital filter comprises an emulation of the adaptive part of the digital filter.

9. A noise cancellation system as claimed in claim 3, wherein the filter characteristic is a cut-off frequency of the digital filter.

* * * * *

UNITED STATES PATENT AND TRADEMARK OFFICE
CERTIFICATE OF CORRECTION

PATENT NO. : 8,682,250 B2  Page 1 of 1
APPLICATION NO. : 13/001586
DATED : March 25, 2014
INVENTOR(S) : Magrath et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 381 days.

Signed and Sealed this
Twenty-ninth Day of September, 2015

Michelle K. Lee
*Director of the United States Patent and Trademark Office*